United States Patent
Fontanella et al.

(10) Patent No.: US 6,246,152 B1
(45) Date of Patent: Jun. 12, 2001

(54) DRIVER CIRCUIT FOR CONTROLLING A PIEZOELECTRIC ACTUATOR IN CHARGE MODE

(75) Inventors: Luca Fontanella, Venice; Giovanni Frattini, Travaco; Giorgio Pedrazzini, Pavia; Giulio Ricotti, Broni, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/441,148

(22) Filed: Nov. 12, 1999

(30) Foreign Application Priority Data

Nov. 13, 1998 (EP) .................................................. 98830684

(51) Int. Cl.$^7$ ..................................................... H02N 2/14
(52) U.S. Cl. ............................................................. 310/317
(58) Field of Search ....................... 310/316.01, 316.02, 310/316.03, 317, 318

(56) References Cited

U.S. PATENT DOCUMENTS

| | | | |
|---|---|---|---|
| 4,841,191 | 6/1989 | Takata et al. ......................... | 310/317 |
| 5,124,666 | 6/1992 | Liu et al. .............................. | 330/253 |
| 6,005,328 | * 12/1999 | Suganuma ....................... | 310/316.01 |

OTHER PUBLICATIONS

Newcomb et al.: "Improving the Linearity of Piezoelectric Ceramic Actuators" Electronics Letters, May 27, 1982, UK, vol. 18, No. 11, pp. 442–444, XP002099361 ISSN 0013–5194.

* cited by examiner

Primary Examiner—Thomas M. Dougherty
(74) Attorney, Agent, or Firm—Theodore E. Galanthay; Allen, Dyer, Doppelt, Milbrath & Gilchrist, P.A.

(57) ABSTRACT

A driver circuit for controlling a piezoelectric actuator in a charge mode includes an amplifier having a first input terminal for receiving a control voltage, a second input terminal, and a main final stage with a main output terminal connected to the piezoelectric actuator. The amplifier also includes an additional final stage with an additional output terminal connected to the second input terminal. The main final stage and the additional final stage are connected in parallel with one another so that a current which passes through the main output terminal is proportional in accordance with a predefined factor to a current which passes through the additional output terminal. The driver circuit includes a device having a constant capacitance connected to the second input terminal so that an electrical charge transferred to the piezoelectric actuator is correlated with the control voltage in accordance with the predefined factor and the capacitance.

31 Claims, 2 Drawing Sheets

DRIVER CIRCUIT FOR CONTROLLING A PIEZOELECTRIC ACTUATOR IN CHARGE MODE

FIELD OF THE INVENTION

The present invention relates to a driver circuit for controlling a piezoelectric actuator in a charge mode, and, more particularly, to a driver circuit.

BACKGROUND OF THE INVENTION

Piezoelectric actuators are used in various applications such as, for example, in disk-storage devices for regulating a mechanical quantity in response to an electrical control quantity. A piezoelectric actuator is formed by a chip enclosed between two metal plates. If the metal plates are charged electrically, the chip is deformed resiliently as if it were subjected to a mechanical stress. The deformation of the chip depends on the previous operation of the piezoelectric actuator as well as on the charge state of the metal plates.

There is more than one relationship between the electrical control quantity and the deformation so that a characteristic curve corresponding to this relationship has a hysteresis loop. The hysteresis loop of the characteristic curve of the piezoelectric actuator is greatly dependent on the type of control used, as well as on the frequency of the control quantity.

The electrical behavior of the piezoelectric actuator may be represented as a first approximation by an equivalent circuit including a capacitor with variable capacitance. A dissipation resistor is connected in parallel to the capacitor during the generation of the mechanical stress. The piezoelectric actuator can therefore be driven by a voltage or by a charge, also referred to as the voltage mode or the charge mode.

A circuit for driving the piezoelectric actuator in the voltage mode enables a voltage applied to the chip to be controlled by a control voltage. The driver circuit, which is formed by an operational amplifier with voltage feedback, is relatively straightforward. However, this approach does not enable the deformation of the chip to be precisely controlled because of the large hysteresis loop of the voltage/deformation characteristic curve of the piezoelectric actuator.

Greater accuracy can, however, be achieved by driving the piezoelectric actuator in the charge mode since the hysteresis loop of the charge-deformation characteristic curve is generally much smaller than that of the voltage/deformation characteristic curve. A circuit for driving the piezoelectric actuator in the charge mode enables a charge transferred to the chip to be controlled by the control voltage. The driver circuit requires an amplifier which measures a current passing through the chip by detecting a voltage at the terminals of a resistor connected in series with the chip. The amplifier produces as an output a quantity indicative of the charge transferred to the chip over time by an integration operation. This quantity is transferred to the input of the drive circuit to interrupt its operation when the charge transferred to the chip reaches a desired value.

A disadvantage of the approach described above is that it requires a complex measuring amplifier, i.e., a sense amplifier. Moreover, in some applications such as, for example, when the piezoelectric actuator is disposed on a suspension arm of a disk-storage device, one plate of the piezoelectric actuator formed by the suspension arm is connected to a reference terminal, such as ground. The resistor used for measuring the current through the chip cannot be connected to ground. This makes it necessary to use a differential sense amplifier. The differential sense amplifier is difficult to produce because of the high values of the input voltage, which are on the order of several tens of volts.

SUMMARY OF THE INVENTION

An object of the present invention is to overcome the aforementioned drawbacks.

The present invention provides a driver circuit for controlling a piezoelectric actuator in a charge mode. The driver circuit comprises an amplifier having a first input terminal for receiving a control voltage, a second input terminal, and a main final stage with an output terminal for the connection of the actuator. The amplifier also includes an additional final stage with an additional output terminal connected to the second input terminal. The main final stage and the additional final stage are connected in parallel with one another. This is done so that a current which passes through the output terminal is proportional, in accordance with a predefined factor, to a current which passes through the additional output terminal.

The driver circuit further includes capacitive means or a capacitor with constant capacitance connected to the second input terminal so that an electrical charge transferred to the actuator is correlated with the control voltage in accordance with the predefined factor and the capacitance.

The present invention also provides a disk-storage storage device comprising this driver circuit.

BRIEF DESCRIPTION OF THE DRAWINGS

Further characteristics and the advantages of the driver circuit according to the present invention will become clear from the following description of a preferred embodiment thereof, provided by way of a non-limiting example, with reference to the appended drawings, in which.

DETAILED DESCRIPTION OF THE PREFERRED EMBODIMENTS

Figure 1:
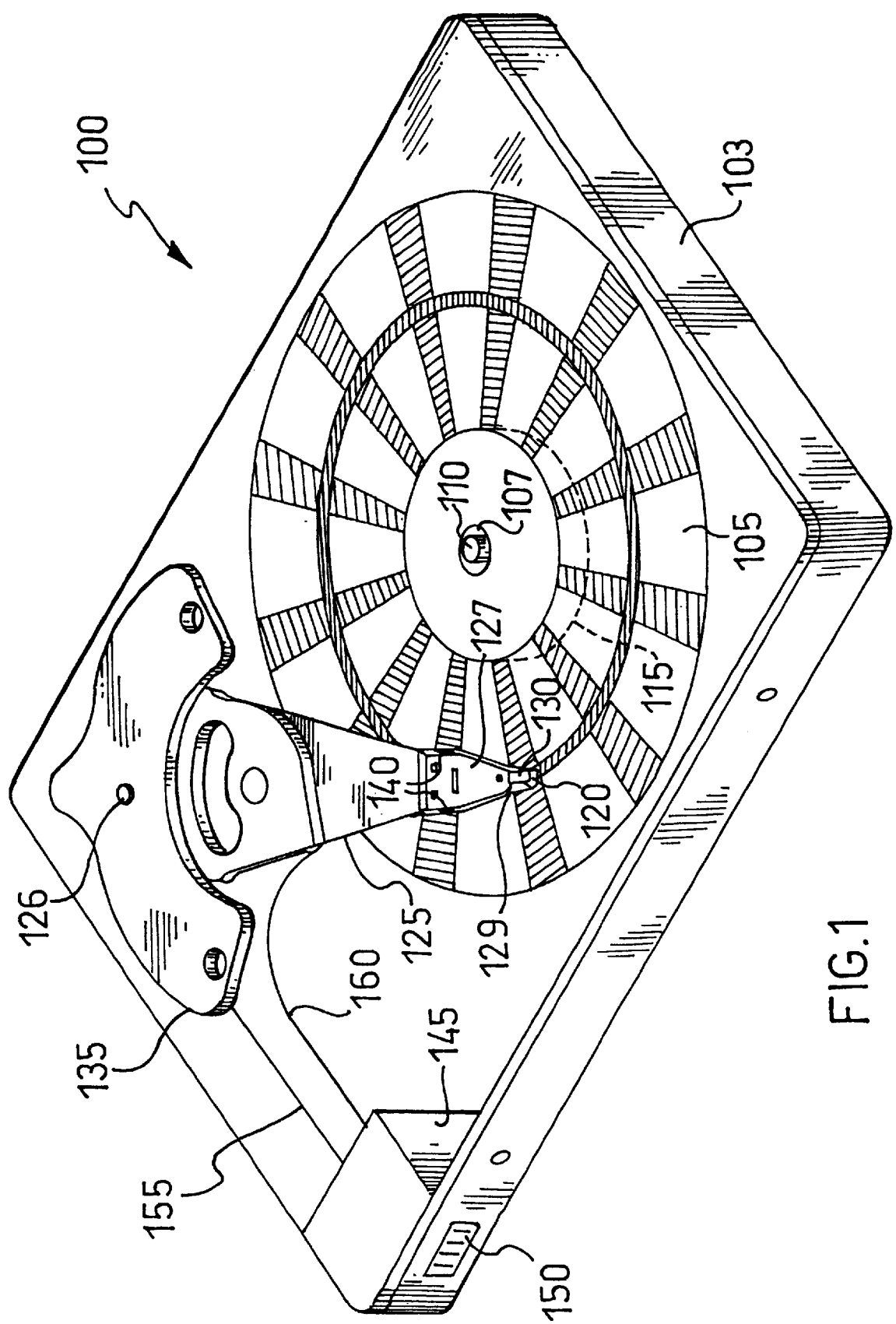
FIG. 1 is a perspective view of a hard-disk storage device in which the driver circuit of the present invention is implemented.

With reference to FIG. 1, a hard-disk storage device 100 includes a sealed container 103, which encloses a disk 105 formed by a rigid circular member covered with a ferromagnetic material. A diameter of the disk 105 may be in a range of about 7 to 10 cm, for example. The disk 105 is connected by a hub 107 to a shaft 110 connected to a suitable electric motor 115. The motor 115 keeps the disk 105 rotating about the shaft 110 at a constant frequency, such as between 100 and 200 Hz, for example.

The disk 105 is divided into tracks concentric with the rotation shaft 110. Each track contains a plurality of cells. Each cell stores one bit of data which is represented by different magnetization states of the ferromagnetic material. Typically, the density of the data along a track is on the order of 120,000 bits per inch (bpi). The data is read from and written on the disk 105 by a read/write head 120. The head 120 is generally formed by an electromagnetic device which can detect or change the magnetization state of a cell disposed beneath it during a respective reading or writing operation.

The storage device 100 includes a suspension arm 125 coupled at one of its ends to a pin 126. The arm 125 terminates in a flexible suspension 127 on the free end of which a slider 129 is mounted for supporting the head 120. Typically, the slider 129 is fixed to the suspension 127 by a gimbal 130 which stiffens the structure with regard to rolling and pitching. The suspension 127 bends to exert a pressure which urges the slide 129 against an upper surface of the disk 105. The slide 129 floats on a cushion of air above the upper surface of the disk 105 when the disk 105 is in rotation. This enables the head 120 to follow the roughness of the disk 105 at an extremely small distance, for example, on the order of 10–30 nm.

A main actuator 135 and a secondary actuator 140 move the head 120 along a substantially radial axis relative to the disk 105 to position the head 120 over the desired track. The main actuator 135, which typically, is formed by a voice-coil motor of the type used in loud speakers, pivots the suspension arm 125 about the pin 126. This roughly positions the head 120 with a resolution of a few $\mu$m.

The secondary actuator 140 is formed by two chips of piezoelectric material. Each of the chips are made of ceramic material suitably polarized permanently in a manner such that its elemental crystals are oriented in a predominant direction. The ceramic material includes, for example, an alloy based on lead, zirconium and titanium, or PZT. Alternatively, quartz or piezoelectric crystal chips, or the like, may be used. The chips of piezoelectric material 140 are fixed, perpendicular to the disk 105, to the sides of an easily deformable portion of the suspension 127. This deformable portion forms a hinge about which a tip of the suspension arm, e.g., a wrist, can pivot. When one chip of piezoelectric material lengthens and the other chip shortens, the deformable portion is bent slightly so that the wrist of the suspension arm consequently pivots about the hinge. This pivoting precisely and rapidly positions the head 120 with a resolution on the order of 0.1 $\mu$m. This allows disks with a very high track density of 25,000 tracks per inch (tpi) to be produced, for example.

A control unit 145 places the storage device 100 into external communications via a connector 150. The control unit 145 is connected to the main actuator 135 by a flexible cable 155, and to the head 120 and to the secondary actuator 140 by a further flexible cable 160. The control unit 145 processes an electrical signal supplied by the head 120 during a read operation, and sends suitable control signals to the head 120 during a write operation. The control unit 145 also controls the main actuator 135 and the secondary actuator 140 to position the head 120 on the desired track.

Similar considerations apply to a storage device with several disks, with a floppy disk, with an optical disk, etc. The present invention may also be used in other applications such as, for example, for controlling the position of objects under a microscope, for controlling printing members of an ink-jet printer, etc.

Figure 2:
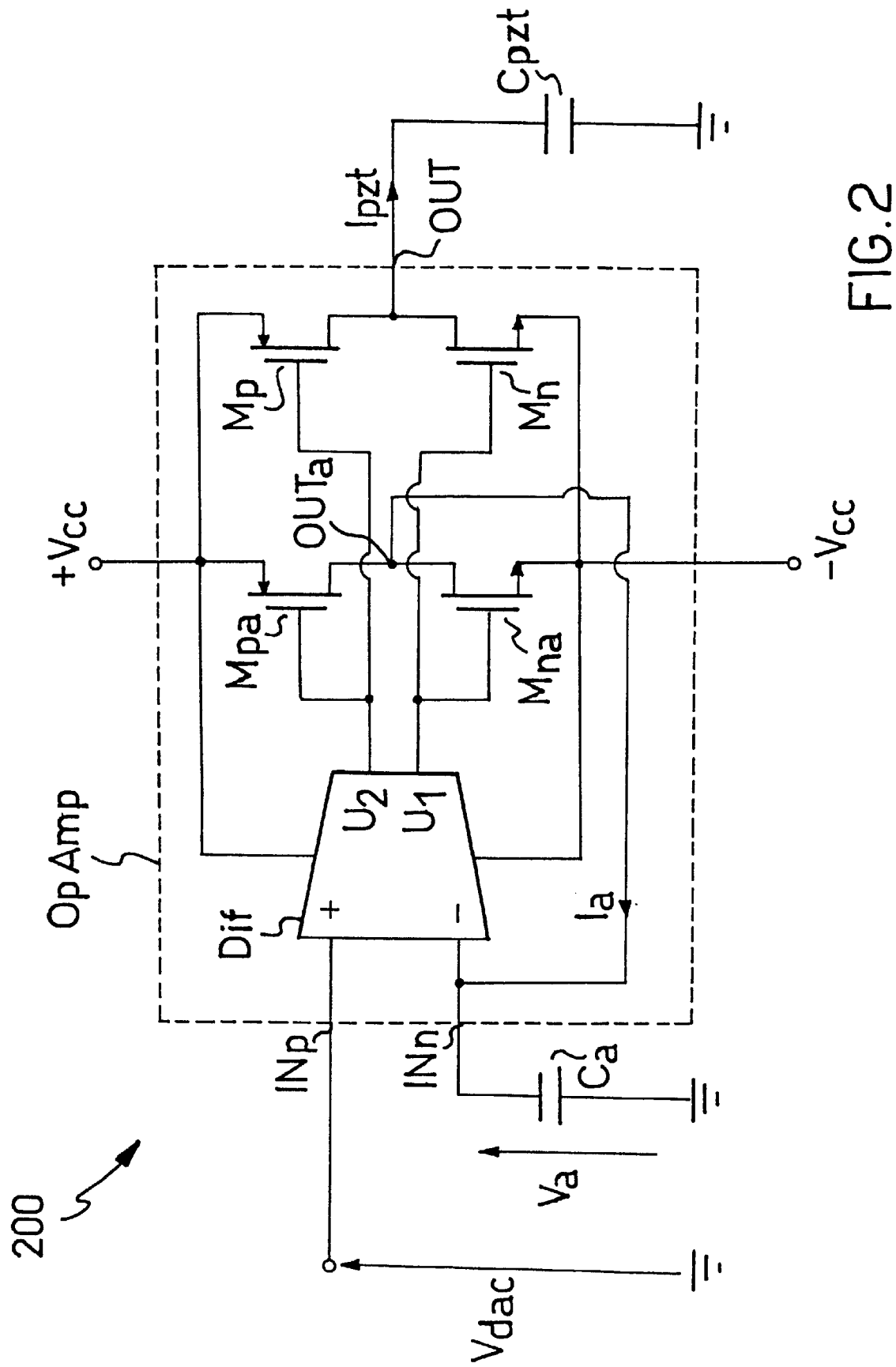
FIG. 2 is a schematic diagram of an embodiment of the driver circuit according to the present invention.

With reference now to FIG. 2, the control unit of the hard-disk storage device 100 includes a driver circuit 200 for each chip of piezoelectric material, which is represented schematically by a capacitor Cpzt with variable capacitance. Similar considerations apply if the circuit 200 simultaneously drives several chips or, in general, any other piezoelectric actuator.

The driver circuit 200 includes an operational amplifier OpAmp having an inverting input terminal INn, a non-inverting input terminal INp, and an output terminal OUT. The operational amplifier OpAmp has a differential input stage Dif having an inverting input terminal (−) and a non-inverting input terminal (+) which form the input terminal INn and the input terminal INp, respectively. The differential stage Dif also has two output terminals U1, U2 and two supply terminals. The supply terminals are connected to a positive supply terminal +Vcc which is relative to a reference or ground terminal, and to a negative supply terminal −Vcc, respectively.

Connected in cascade with the differential stage Dif is a main final power stage formed by two symmetrically complementary MOS field-effect transistors. In particular, the output terminals U1 and U2 of the differential stage Dif are connected to the base terminals of an n-channel MOS transistor Mn and a p-channel MOS transistor Mp, respectively. The source terminal of the transistor Mn is connected to the negative supply terminal −Vcc, and the source terminal of the transistor Mp is connected to the positive supply terminal +Vcc. The drain terminals of the transistors Mn and Mp are connected to one another and define the output terminal OUT.

A control voltage Vdac relative to ground is produced by converting a suitable digital control signal into analog form, which is applied to the non-inverting input terminal Inp. The chip of piezoelectric material Cpzt is connected between the output terminal OUT and the ground terminal.

In the driver circuit 200 according to the present invention, there is an additional final stage similar to the main final stage Mp, Mn. In the embodiment shown in the drawing, the output terminals U1 and U2 of the differential stage Dif are connected to the base terminal of an n-channel MOS transistor Mna and a p-channel MOS transistor Mpa, respectively. The source terminal of the transistor Mna is connected to the negative supply terminal −Vcc, and the source terminal of the transistor Mpa is connected to the positive supply terminal +Vcc. The drain terminals of the transistors Mna and Mpa are connected to one another to define an output terminal OUTa of the additional final stage Mna, Mpa and are connected to the inverting input INn.

The main final stage Mn, Mp and the additional final stage Mna, Mpa, are connected in parallel with one another. A current Ipzt which passes through the output terminal OUT, and which is supplied to the chip of piezoelectric material Cpzt, is therefore proportional in accordance with a predefined factor K to a current Ia which passes through the output terminal OUTa of the additional final stage Mna, Mpa. This current is represented as Ipzt, which is equal to K*Ia. The predefined factor K is dependent on the physical structure of the transistors Mn, Mp and Mna, Mpa. The driver circuit 200 also includes a capacitor Ca or an equivalent device having a constant capacitance value. The capacitor Ca is connected between the inverting input terminal INn and the ground terminal.

To explain the operation of the driver circuit 200 described above using as a basis the definition of current, the variation over time of an electrical charge Qpzt stored in the chip of piezoelectric material Cpzt is dQpzt=Ipzt*dt. Similarly, the variation over time of an electrical charge Qa stored in the capacitor Ca is dQa=Ia*dt=Ipzt*dt/K=dQpzt/K. The variable Ca indicates the capacitance of the capacitor identified by the same symbol in the drawing, and Va indicates the voltage at the terminals thereof. Using as a basis the definition for capacitance, dQa=Ca*dVa, from which dQpzt/K=Ca*dVa, and hence dQpzt=K*Ca*dVa.

It is assumed that a control voltage of value Vdac is applied to the non-inverting input terminal INp. The input terminals INn and INp are at the same potential so that the voltage at the terminals of the capacitor Ca is brought (after a transition of negligible duration) from an initial zero value to an operating value equal to Vdac. By integrating the equation given above, the corresponding variation DQpzt of the electrical charge stored in the chip of piezoelectric material Cpzt is DQpzt=(K*Ca)*Vdac. The electrical charge DQpzt transferred to the chip of piezoelectric material Cpzt is therefore directly proportional to the control voltage Vdac in accordance with the predefined factor K and the capacitance Ca.

Similar considerations apply if a different amplifier is used, preferably one with a high gain and very high input impedance. Similar considerations also apply if the main final stage Mn, Mp and the additional final stage Mna, Mpa are formed in another manner, such as differing from one another in structure, for example, with bipolar transistors. In addition, the amplifier may be formed with diodes for reducing cross-over distortion, or the chip of piezoelectric material Cpzt and the capacitor Ca are not connected to ground, etc.

The electrical charge DQpzt transferred to the chip of piezoelectric material Cpzt is correlated generically with the control voltage Vdac in accordance with the predefined factor K and the capacitance Ca. These values are fixed, stable and easily determined. This enables the electrical charge actually transferred to the chip of piezoelectric material Cpzt, and hence the deformation thereof, to be controlled extremely accurately by the control voltage Vdac. Moreover, the driver circuit of the present invention is relatively straightforward. This circuit does not require a sense amplifier for actually detecting the current supplied to the chip of piezoelectric material Cpzt. In contrast, the structure described above utilizes the negative feedback from the capacitor Ca and from the additional final stage Mna, Mpa to set the desired current in the main final stage Mn, Mp directly.

In a preferred embodiment of the present invention, the predefined factor K is greater than 1, for example, between 1 and 100. This reduces the power dissipated in the capacitor Ca and permits the use of a control voltage Vdac of a value substantially lower (a few volts, for example) than a voltage at the terminals of the chip of piezoelectric material Cpzt (a few tens of volts, for example). The present invention may, however, also be implemented with any other value of the predefined factor K, even equal to or less than 1, for example, with the main and additional final stages identical to one another.

To satisfy contingent and specific requirements, an expert in the art may apply to the above-described driver circuit many modifications and variations all of which, however, are included within the scope of protection of the invention as defined by the following claims.

That which is claimed is:

1. A driver circuit for controlling a piezoelectric actuator in a charge mode, the driver circuit comprising:
    an amplifier having a first input terminal for receiving a control voltage, and a second input terminal, said amplifier comprising
        a main final stage having a main output terminal for connecting to the piezoelectric actuator, and
        an additional final stage having an additional output terminal connected to the second input terminal,
        the main final stage and the additional final stage being connected in parallel with one another so that a current through the main output terminal is proportional to a current through the additional output terminal in accordance with a predefined factor; and
    a capacitance device connected to the second input terminal and having a constant capacitance value so that an electrical charge transferred to the piezoelectric actuator is correlated with the control voltage in accordance with the predefined factor and the capacitance value.

2. A driver circuit according to claim 1, wherein the predefined factor is greater than 1.

3. A driver circuit according to claim 1, wherein the predefined factor is between a range of about 1 to 100.

4. A driver circuit according to claim 1, wherein said capacitance device is connected to a reference terminal along with the piezoelectric actuator.

5. A driver circuit according to claim 1, wherein said amplifier comprises an operational amplifier wherein the first input terminal is a non-inverting input terminal and the second input terminal is an inverting input terminal.

6. A driver circuit according to claim 1, wherein said main final stage and said additional final stage each comprises a symmetrically complementary structure.

7. A driver circuit according to claim 6, wherein:
    said amplifier comprises a differential input stage having first and second terminals connected to respective first and second input terminals, first and second output terminals, and first and second voltage supply terminals;
    said main final stage comprising first and second transistors connected together, said first and second transistors having opposite polarities and each having a first power terminal connected to the main output terminal;
    said additional final stage comprising third and fourth transistors connected together, said third transistor having a same polarity as said first transistor, said fourth transistor having a same polarity as said second transistor, and said third and fourth transistors each having a first power terminal connected to the additional output terminal;
    said first and third transistors each having a second power terminal connected to the first supply terminal, and a control terminal connected to the first output terminal of said differential stage; and
    said second and fourth transistors each having a second power terminal connected to the second supply terminal, and a control terminal connected to the second output terminal of said differential stage.

8. A driver circuit according to claim 7, wherein said first and third transistors each comprises an n-channel MOS transistor; and wherein said second and fourth transistors each comprises a p-channel MOS transistor.

9. A driver circuit for controlling a piezoelectric actuator in a charge mode, the driver circuit comprising:
    an amplifier having a first input terminal for receiving a control voltage, and a second input terminal, said amplifier comprising
        a main final stage having a main output terminal for connecting to the piezoelectric actuator, and
        an additional final stage having an additional output terminal connected to the second input terminal,
        the main final stage and the additional final stage being connected in parallel with one another so that a current through the main output terminal is based upon a current through the additional output terminal in accordance with a predefined factor; and
    a capacitance device connected to the second input terminal.

10. A driver circuit according to claim 9, wherein the predefined factor is greater than 1.

11. A driver circuit according to claim 9, wherein the predefined factor is between a range of about 1 to 100.

12. A driver circuit according to claim 9, wherein said capacitance device is connected to a reference terminal along with the piezoelectric actuator.

13. A driver circuit according to claim 9, wherein said amplifier comprises an operational amplifier wherein the first input terminal is a non-inverting input terminal and the second input terminal is an inverting input terminal.

14. A driver circuit according to claim 9, wherein said main final stage and said additional final stage each comprises a symmetrically complementary structure.

15. A driver circuit according to claim 9, wherein:
said amplifier comprises a differential input stage having first and second terminals connected to respective first and second input terminals, first and second output terminals, and first and second voltage supply terminals;
said main final stage comprising first and second transistors connected together, said first and second transistors having opposite polarities and each having a first power terminal connected to the main output terminal;
said additional final stage comprising third and fourth transistors connected together, said third transistor having a same polarity as said first transistor, said fourth transistor having a same polarity as said second transistor, and said third and fourth transistors each having a first power terminal connected to the additional output terminal;
said first and third transistors each having a second power terminal connected to the first supply terminal, and a control terminal connected to the first output terminal of said differential stage; and
said second and fourth transistors each having a second power terminal connected to the second supply terminal, and a control terminal connected to the second output terminal of said differential stage.

16. A driver circuit according to claim 15, wherein said first and third transistors each comprises an n-channel MOS transistor; and wherein said second and fourth transistors each comprises a p-channel MOS transistor.

17. A disk-storage device comprising:
a read/write head;
at least one suspension arm connected to said read/write head;
a main actuator connected to said at least one suspension arm for pivoting the same; and
a piezoelectric actuator for pivoting a free end of said at least one suspension arm;
a driver circuit connected to said piezoelectric actuator for controlling said piezoelectric actuator in a charge mode, said driver circuit comprising the driver circuit comprising:
an amplifier having a first input terminal for receiving a control voltage, and a second input terminal, said amplifier comprising
a main final stage having a main output terminal for connecting to the piezoelectric actuator, and
an additional final stage having an additional output terminal connected to the second input terminal, the main final stage and the additional final stage being connected in parallel with one another so that a current through the main output terminal is based upon a current through the additional output terminal in accordance with a predefined factor; and
a capacitance device connected to the second input terminal.

18. A disk-storage device according to claim 17, wherein the predefined factor is greater than 1.

19. A disk-storage device according to claim 17, wherein the predefined factor is between a range of about 1 to 100.

20. A disk-storage device according to claim 17, wherein said capacitance device is connected to a reference terminal along with said piezoelectric actuator.

21. A disk-storage device according to claim 17, wherein said amplifier comprises an operational amplifier wherein the first input terminal is a non-inverting input terminal and the second input terminal is an inverting input terminal.

22. A disk-storage device according to claim 17, wherein said main final stage and said additional final stage each comprises a symmetrically complementary structure.

23. A disk-storage device according to claim 22, wherein:
said amplifier comprises a differential input stage having first and second terminals connected to respective first and second input terminals, first and second output terminals, and first and second voltage supply terminals;
said main final stage comprising first and second transistors connected together, said first and second transistors having opposite polarities and each having a first power terminal connected to the main output terminal;
said additional final stage comprising third and fourth transistors connected together, said third transistor having a same polarity as said first transistor, said fourth transistor having a same polarity as said second transistor, and said third and fourth transistors each having a first power terminal connected to the additional output terminal;
said first and third transistors each having a second power terminal connected to the first supply terminal, and a control terminal connected to the first output terminal of said differential stage; and
said second and fourth transistors each having a second power terminal connected to the second supply terminal, and a control terminal connected to the second output terminal of said differential stage.

24. A disk-storage device according to claim 23, wherein said first and third transistors each comprises an n-channel MOS transistor; and wherein said second and fourth transistors each comprises a p-channel MOS transistor.

25. A disk-storage device according to claim 17, wherein the storage device is a magnetic hard disk.

26. A method for controlling a piezoelectric actuator in a charge mode using a driver circuit comprising an amplifier including a main final stage having a main output terminal connected to the piezoelectric actuator and an additional final stage having an additional output terminal connected to a second input terminal, the main final stage and the additional final stage being connected in parallel, the step of controlling comprising the step of:
applying a control voltage to a first input terminal of the amplifier for conducting current through the main output terminal based upon current conducting through the additional output terminal in accordance with a predefined factor.

27. A method according to claim 26, wherein the step of selecting comprises selecting the predefined factor to be greater than 1.

28. A method according to claim 26, wherein the step of selecting comprises selecting the predefined factor to be between a range of about 1 to 100.

29. A method according to claim 26, wherein a capacitor is connected to a reference terminal along with the piezoelectric actuator.

30. A method according to claim 26, wherein amplifier comprises an operational amplifier wherein the first input terminal is a non-inverting input terminal and the second input terminal is an inverting input terminal.

31. A method according to claim 26, wherein the main final stage and the additional final stage each comprises a symmetrically complementary structure.

* * * * *